United States Patent
Nakano et al.

(10) Patent No.: US 8,772,732 B2
(45) Date of Patent: Jul. 8, 2014

(54) SCANNING CHARGED PARTICLE BEAM DEVICE AND METHOD FOR CORRECTING CHROMATIC SPHERICAL COMBINATION ABERRATION

(75) Inventors: Tomonori Nakano, Kodaira (JP);
Takeshi Kawasaki, Musashino (JP);
Kotoko Hirose, Matsudo (JP)

(73) Assignee: Hitachi High-Technologies Corporation, Tokyo (JP)

( * ) Notice: Subject to any disclaimer, the term of this patent is extended or adjusted under 35 U.S.C. 154(b) by 0 days.

(21) Appl. No.: 13/502,754

(22) PCT Filed: Sep. 29, 2010

(86) PCT No.: PCT/JP2010/066979
§ 371 (c)(1),
(2), (4) Date: Apr. 19, 2012

(87) PCT Pub. No.: WO2011/052333
PCT Pub. Date: May 5, 2011

(65) Prior Publication Data
US 2012/0199739 A1     Aug. 9, 2012

(30) Foreign Application Priority Data

Oct. 26, 2009 (JP) ................................. 2009-245350

(51) Int. Cl.
*H01J 37/28* (2006.01)
(52) U.S. Cl.
USPC ................... 250/396 R; 250/307; 250/310
(58) Field of Classification Search
USPC ......................................... 250/307
See application file for complete search history.

(56) References Cited

U.S. PATENT DOCUMENTS 7,205,551 B2 * 4/2007 Uno .............................. 250/397
2001/0025925 A1 * 10/2001 Abe et al. ...................... 250/307
(Continued)

FOREIGN PATENT DOCUMENTS

JP    2003-197140 A    7/2003
JP    2004-087460 A    3/2004
(Continued)

OTHER PUBLICATIONS

Zach et al.; "Aberration correction in a low voltage SEM by a multipole corrector"; Nuclear Instruments and Methods in Physics Research; vol. 363; 1995; pp. 316-325.

(Continued)

*Primary Examiner* — Michael Logie
*Assistant Examiner* — Kevin Chung
(74) *Attorney, Agent, or Firm* — Mattingly & Malur, PC

(57) ABSTRACT

Disclosed is a scanning charged particle beam apparatus equipped with an aberration corrector, contrived to eliminate resolution degradation in tilt observation by a chromatic third-order aperture aberration without relying on a specific optical system. A controller of the scanning charged particle beam apparatus provides a chromatic third-order aperture aberration measurement method relevant to tilt observation of a specimen. Further, the controller has a chromatic aberration control function relevant to tilt observation of a specimen. By means of the chromatic aberration control function, the controller controls a chromatic aberration to be positive or negative, rather than remaining at 0, in order to eliminate an image blur which occurs in a direction parallel to the specimen surface due to a chromatic third-order aperture aberration and a chromatic aberration at a tilt angle (t1) under observation and another tilt angle (−t1) axially opposite to the tilt angle.

12 Claims, 6 Drawing Sheets

(56) References Cited

U.S. PATENT DOCUMENTS

| | | | |
|---|---|---|---|
| 2004/0036030 A1* | 2/2004 | Matsuya et al. | 250/396 R |
| 2005/0017194 A1* | 1/2005 | Matsuya et al. | 250/396 R |
| 2006/0033037 A1 | 2/2006 | Kawasaki et al. | |
| 2006/0054837 A1* | 3/2006 | Uno | 250/397 |
| 2006/0151698 A1* | 7/2006 | Sasaki et al. | 250/310 |
| 2007/0114408 A1* | 5/2007 | Honda et al. | 250/310 |
| 2007/0125945 A1* | 6/2007 | van der Zande et al. | 250/307 |
| 2008/0067377 A1* | 3/2008 | Hatakeyama et al. | 250/310 |
| 2009/0212228 A1* | 8/2009 | Hirose et al. | 250/396 R |

FOREIGN PATENT DOCUMENTS

| | | |
|---|---|---|
| JP | 2006-54074 A | 2/2006 |
| JP | 2007-128656 A | 5/2007 |
| JP | 2008-181778 A | 8/2008 |

OTHER PUBLICATIONS

Matsuya et al.; "Resolution estimation of low electron energy probe lens system"; Nuclear Instruments and Methods in Physics Research; vol. 519; 2004; pp. 264-279.

* cited by examiner

SCANNING CHARGED PARTICLE BEAM DEVICE AND METHOD FOR CORRECTING CHROMATIC SPHERICAL COMBINATION ABERRATION

TECHNICAL FIELD

The present invention relates to a scanning charged particle beam apparatus that scans and irradiates a specimen with a charged particle beam and, from the specimen, obtains secondary electrons, backscattered electrons, or transmitted electrons and, in particular, a technique for correcting a chromatic third-order aperture aberration in tilt observation on such apparatus.

BACKGROUND ART

In charged particle beam apparatus including electron microscopes such as a Scanning Electron Microscope (SEM) and a Transmission Electron Microscope (TEM), lenses making use of electrical or magnetic fields are necessarily employed to converge a charged particle beam. In electrostatic or magnetic lenses, various types of aberrations occur inevitably. Consequently, even when trying to narrow down a charged particle beam with a high ratio of demagnification, if there is a large aberration, it is impossible to decrease the diameter of a spot and it is impossible to improve the precision of observing microstructures and measuring dimensions.

In charged particle beam apparatus, the introduction of an aberration corrector is promoted for the purpose of improving resolution. The aberration corrector is normally configured with multipole lenses installed in multiple stages and generates an electrical or magnetic field inside the multipole lenses, thereby removing an aberration included in a charged particle beam passing through an opening inside the lenses.

As regards the aberration corrector, there is one that uses four stages of multipole lenses, for example, as disclosed in Non Patent Literature 1.

In charged particle beam apparatus, there is an aberration caused by the fact that an accelerating voltage is not completely constant and has a range of energy. Those typical of this aberration are a chromatic aberration and a magnification chromatic aberration. In the present specification, an amount of dispersion (blur) caused by the magnification chromatic aberration is particularly referred to as a chromatic dispersion aberration. In the aberration corrector of Non Patent Literature 1, a technique for correcting the chromatic aberration is disclosed. In Non Patent Literature 1, however, there is no disclosure about measurement of a chromatic third-order aperture aberration or chromatic third-order aperture aberration and a technique for correcting a chromatic third-order aperture aberration when a tilt observation technique is applied.

An issue concerning the chromatic third-order aperture aberration during aberration correction is disclosed in Non Patent Literature 2. Non Patent Literature 2 discloses conditions under which resolution is limited by an increase in the chromatic third-order aperture aberration and a fifth-order spherical aberration as a result of aberration correction and, it is disclosed that, as a countermeasure, an effective length between the aberration corrector and an objective lens should be shortened. In Non Patent Literature 2, however, a method of measuring an actual chromatic third-order aperture aberration is not disclosed and a method of counterbalancing a chromatic third-order aperture aberration and some other aberration during tilt observation is not disclosed as well.

As a tilt observation technique taking account of aberration correction for charged particle beam apparatus, there exists, for example, a technique that is disclosed in patent literature 1. This technique is disclosed as a technique for improving resolution by performing aberration correction in tilt observation. However, there is no disclosure about measurement of a chromatic third-order aperture aberration and a technique for correcting a chromatic third-order aperture aberration during tilt observation.

Moreover, as a technique for detecting a chromatic dispersion aberration of charged particle beam apparatus and correcting it, there exists, for example, a technique that is disclosed in patent literature 2. This technique is adapted to correct a beam displacement in a situation when the beam becomes off axis with an accelerating voltage being changed from a current value. However, there is no disclosure about an aberration corrector and a tilt observation technique by means of the aberration corrector.

CITATION LIST

Patent Literature

Patent Literature 1: Japanese Patent Application Laid-Open Publication No. 2006-054074
Patent Literature 2: Japanese Patent Application Laid-Open Publication No. 2008-181778

Non Patent Literatures

Non Patent Literature 1: Nuclear Instruments and Methods in Physics Research, A363 (1995), pp. 316-325
Non Patent Literature 2: Nuclear Instruments and Methods in Physics Research, A519 (2004), pp. 264-279

SUMMARY OF INVENTION

Technical Problem

A problem encountered when performing tilt observation after having corrected aberrations by the method described in Patent Literature 1 lies in that correction taking account of a chromatic third-order aperture aberration is not performed and, thus, resolution is limited because of the chromatic third-order aperture aberration. A problem encountered when performing tilt observation while diminishing a chromatic third-order aperture aberration by the method disclosed in Non Patent Literature 2 lies in that there is not a technique for measuring the chromatic third-order aperture aberration, which is required to optimize such aberration. Besides, optimizing the chromatic third-order aperture aberration by the method disclosed in Non Patent Literature 2 entails magnification change for an optical system, which results in that all other aberrations change concurrently. Here is a problem that a lot of time and labor are taken for complete adjustment and a problem posed is that, in practice, the aberrations are not corrected completely and some of them remain uncorrected. Yet, a chromatic third-order aperture aberration itself does not occur if chromatic aberration correction and spherical aberration correction are not performed at all. But, in that case, the resolution during tilt observation degrades due to a spherical aberration and, particularly, a chromatic aberration. Moreover, in the method disclosed in Non Patent Literature 2, optical conditions are fixed and, thus, this also posed the following problems: a decrease in the degree of freedom of an optical system; poor usability for tilt observation; and optimum conditions for resolution are not always attained.

An object of the present invention, focusing on such problems of related art, is to provide a scanning charged particle beam apparatus capable of improving resolution in tilt observation using an aberration corrector by correcting a chromatic third-order aperture aberration.

Solution to Problem

To achieve the above-mentioned object, the present invention provides a scanning charged particle beam apparatus making use of a charged particle beam having a specimen stage on which a specimen is mounted, an aberration corrector that corrects an aberration of an incoming primary charged particle beam, and a deflector that is disposed above the aberration corrector and deflects the primary charged particle beam, and comprising an irradiation optical system that scans the primary charged particle beam over a specimen mounted on the specimen stage, a detector that detects secondary charged particles generated by scanning the charged particle beam, and a display unit that displays an image from output signals of the detector. This apparatus implements control to measure a chromatic third-order aperture aberration quantity by control of changing the angle and direction of irradiation of the primary charged particle beam onto the specimen by means of the deflector and changing an accelerating voltage for the primary charged particle beam. The invention also provides a chromatic third-order aperture aberration measurement method.

To achieve the above-mentioned object, the present invention also provides a scanning charged particle beam apparatus and a method in which control is implemented such that a controller in measuring a chromatic third-order aperture aberration quantity, with regard to image displacement occurring with changing the accelerating voltage, calculates image displacements and direction per unit voltage of the accelerating voltage changed; when calculating the image displacements and direction per unit voltage, the controller measures tilts of the primary charged particle beam for at least three different angles in a same direction with respect to the axis of tilt, approximates the image displacements per unit voltage with a variable for which the tilt angles are assigned as a polynomial, and calculates a chromatic third-order aperture aberration quantity from a third order coefficient of the polynomial.

To achieve the above-mentioned object, the present invention further provides a scanning charged particle beam apparatus and a method in which control is implemented such that the controller in measuring a chromatic third-order aperture aberration quantity, causes defocusing to arise by changing the accelerating voltage and calculates defocus amounts and direction per unit voltage of the accelerating voltage changed for the defocusing; when calculating the defocus amounts and direction per unit voltage, the controller measures tilts of the primary charged particle beam for at least two different angles in a same direction with respect to the axis of tilt, approximates the defocus amounts per unit voltage with a variable for which the tilt angles are assigned as a polynomial, and calculates a chromatic third-order aperture aberration quantity from a second order coefficient of the polynomial.

Furthermore, a scanning charged particle beam apparatus and a method are provided in which the controller has a chromatic aberration control function relevant to tilt observation of a specimen and, by means of the chromatic aberration control function, controls a chromatic aberration to be positive or negative, rather than remaining at 0, in order to eliminate an image blur which occurs in a direction parallel to the specimen surface due to a chromatic third-order aperture aberration and a chromatic aberration at a tilt angle under observation and another tilt angle axially opposite to the tilt angle.

According to the present invention, a charged particle beam apparatus equipped with an aberration correction function (means), in tilt observation, makes a stepwise change of the accelerating voltage for a plurality of different tilt angles and, from beam displacement or defocusing occurring with the change, measures a chromatic third-order aperture aberration quantity. When tilt observation is performed, a chromatic third-order aperture aberration is compensated, at a given angle (tilt angle) under observation, by controlling a chromatic aberration correction quantity or a chromatic dispersion aberration correction quantity or a spherical aberration correction quantity, thereby improving resolution.

Advantageous Effects of Invention

The present invention provides a chromatic third-order aperture aberration measurement method and a method of counterbalancing a chromatic third-order aperture aberration and another aberration during tilt observation. Accordingly, optical conditions do not need to be fixed and can be adjusted precisely without consuming time and a high resolution in tilt observation can be achieved. Thus, an adjustment of the aberration corrector required upon switching between a no-tilt mode and a tilt-observation mode can be performed in a short time and it is possible to improve resolution in observing sidewalls of a three-dimensional structure.

DESCRIPTION OF EMBODIMENTS

As embodiments of the present invention, various embodiments applied to a scanning electron microscope (SEM) are described. For other types of electron beam application apparatus and other types of charged particle beam apparatus using photons, ions, and the like, a method that is basically the same as any of the embodiments which will be described in the following can be applied although the structures of their lenses and aberration correctors vary according to the type. An aberration corrector is assumed to be able to correct geometrical aberrations up to a third order including spherical aberration, first-order chromatic aberration, and 0th-order chromatic dispersion. A chromatic third-order aperture aberration herein means a combination aberration of a chromatic aberration and a spherical aberration and is proportional to a first order of energy and a third order of aperture angle.

First Embodiment

In the present exemplary embodiment, the following are set forth: a chromatic third-order aperture aberration measurement method for a scanning electron microscope (SEM) and a method for eliminating resolution degradation due to a chromatic third-order aperture aberration during tilt observation after aberration correction.

Structure of the apparatus is first described, a flow of the measurement method is then described, and, finally, the method for eliminating resolution degradation when tilts occur is described. In the present exemplary embodiment, a chromatic third-order aperture aberration quantity is measured by control of changing the angle and direction of irradiation of an electron beam onto a specimen by means of a deflector of the scanning electron microscope (SEM) and changing an accelerating voltage applied to an electron beam source. For the measurement of a chromatic third-order aperture aberration quantity, in the present exemplary embodiment, with regard to image displacement occurring with changing the accelerating voltage by a function of controlling the accelerating voltage for the electron beam source, image displacements and direction per unit voltage of the accelerating voltage changed are calculated. When calculating the image displacements and direction per unit voltage, tilts of the electron beam are measured for at least three different angles (tilt angles) in a same direction with respect to the axis of tilt. The image displacements per unit voltage with a variable for which the tilt angles are assigned are approximated as a polynomial and a chromatic third-order aperture aberration quantity is calculated from a third order coefficient of this polynomial.

Figure 1:
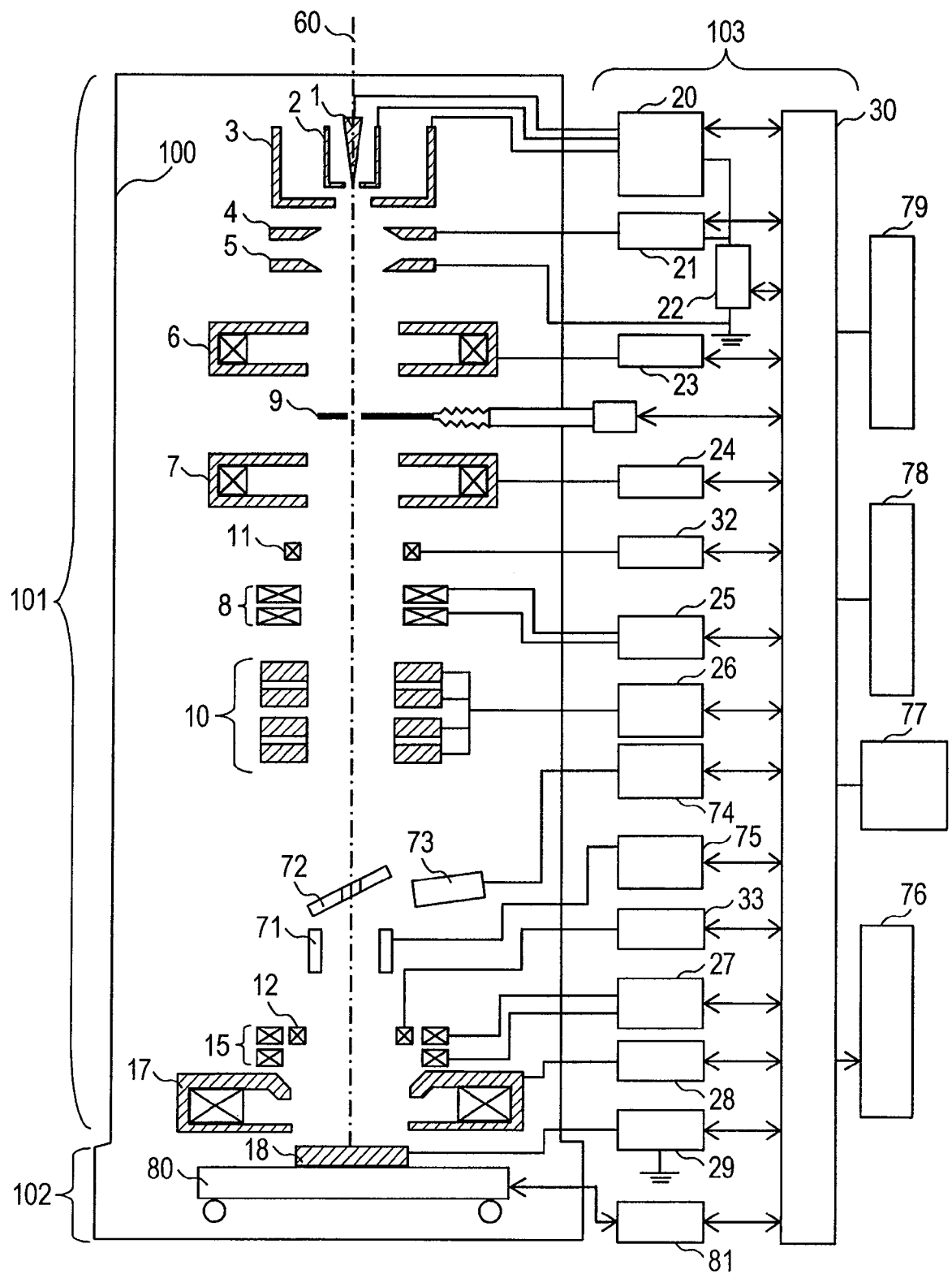
FIG. 1 is a diagram depicting a schematic structure of a scanning electron microscope, pertaining to respective exemplary embodiments.

A schematic structure of the scanning electron microscope (SEM) pertaining to the present exemplary embodiment is shown in FIG. 1. This structure of the scanning electron microscope (SEM) is used for not only the present exemplary embodiment, but also for other exemplary embodiments commonly. The scanning electron microscope is generally composed of a SEM column 101 for electron beam irradiation and scanning over a specimen, a specimen chamber 102 in which a specimen stage is accommodated, and a control unit 103 as a controller for controlling all components in the SEM column 101 and the specimen chamber 102, among others. In the control unit 103 as the controller, a control computer 30, an electron gun's power supply 20 and other components' power supplies 21, 22, 23, 24, 25, 26, 27, 28, 29, 32, 33, 74, 75, and a specimen stage control mechanism 81 are included.

Furthermore, to the control unit 103, a data storage 76 for storing and preserving given information and programs or the like for causing the control computer 103 to operate, a monitor 77 which is a display unit to display an acquired image, an operator console 78 serving as a man-machine interface between the apparatus and its user, and an aberration computation device 79 are connected. The operator console 78 is configured with an information input unit including, e.g., a keyboard, a mouse, etc. The aberration computation device 79 is a computation device that computes various aberrations which will be described later and a result of its computation is stored into the data storage 76. This aberration computation function can be implemented by program processing that is executed by a Central Processing Unit (CPU) which is a processing unit, not shown, within the control computer 30. In this case, needless to say, the control computer stores a chromatic third-order aperture aberration and others calculated by it into the data storage 76. Thus, in the present specification, the function of the aberration computation device 79 is included in the control unit.

Components within the SEM column 101 are first described. A Schottky electron source 1 is an electron source that uses a Schottky effect, in which oxygen and zirconium or a similar substance are scattered in a single crystal of tungsten, and a suppressor electrode 2 and an extraction electrode 3 are provided in proximity to the electron source. By heating the Schottky electron source 1 and applying a voltage of about +2 kV between the electron source and the extraction electrode 3, Schottky electrons are emitted. A negative voltage is applied to the suppressor electrode 2 and electrons are prevented from emitting from a body other than the tip of the Schottky electron source 1. Electrons going through an opening of the extraction electrode 3 are accelerated and converged by an electrostatic lens formed of a first anode 4 and a second anode 5 and go into subsequent components along an optical axis 60. A beam of the electrons is converged by a first condenser lens 6, the beam current is restricted by a movable aperture 9, and the electron beam goes through a second condenser lens 7 and a deflector 8 and into an aberration corrector 10.

At the condenser lens 7, the beam to go into the aberration corrector 10 is adjusted to be a parallel beam. The trajectory of the electron beam without a tilt is adjusted by the deflector 8 to go through the axis of the aberration corrector 10. In the present exemplary embodiment, a quadrupole-octopole type aberration corrector 10 is described, taking it as an example.

In respective stages of the aberration corrector 10, a quadrupole and an octopole are formed. When 12-pole electrodes (which may also serve as magnetic poles) are used, besides the quadrupole and octupole, a dipole, hexapole, and dodecapole can be formed which are used to electrically correct a distorted field caused by an error in the assembly of electrodes or magnetic poles and non-uniformity of magnetic materials. The electron beam to which a chromatic aberration and a spherical aberration to be counterbalanced with a chromatic aberration and a spherical aberration of an objective lens 17 respectively have been given by the aberration corrector 10 is deflected by an objective aligner 12 to go through the axis of the objective lens and focused on the specimen 18 by the objective lens 17, and its spot is scanned over the specimen by a scanning deflector 15.

Inside the specimen chamber 102, a specimen stage 80 with a specimen mount plane on which the specimen 18 is mounted is accommodated. Secondary electrons generated by electron beam irradiation pass through the objective lens 17 and hit against a reflector 72, by which electrons are generated. The generated electrons are detected by a secondary electron detector 73 and a position in which the secondary electrons hit against the reflector 72 can be adjusted by an ExB deflector 71. Detected secondary electron signals are input to the control computer 30 as brightness signals in synchronization with scanning. The control computer 30 executes suitable processing on the input brightness signal information and a SEM image is displayed on the monitor 77. Although only one detector is shown here, a plurality of detectors can be disposed so that an image can be acquired, while making a selection in energy and angular distribution of backscattered or secondary electrons. The reflector 72 is not always necessarily required, if secondary electrons are directly converged on the secondary electron detector 73 by the E×B deflector 71 or if the secondary electron detector having a shape of a coaxial circular plate with an opening in the center is disposed on the optical axis 60.

The control unit 103 which is the controller, as mentioned above, is configured with the electron gun's power supply 20, a control voltage source 21, an accelerating voltage source 22, a first condenser lens's power supply 23, a second condenser lens's power supply 24, a deflection coil's power supply 25, an aberration corrector's power supply 26, a scanning coil's power supply 27, an objective lens's power supply 28, a retarding power supply 29, the control computer 30, an astigmatism correction coil's power supply 32, an objective aligner's power supply 33, a secondary electron detector's power supply 74, an E×B deflector's power supply 75, the specimen stage control mechanism 81, etc., each of which is connected to its corresponding component within the SEM column through a signal transmission line, an electrical wiring line, or the like.

Figure 2:
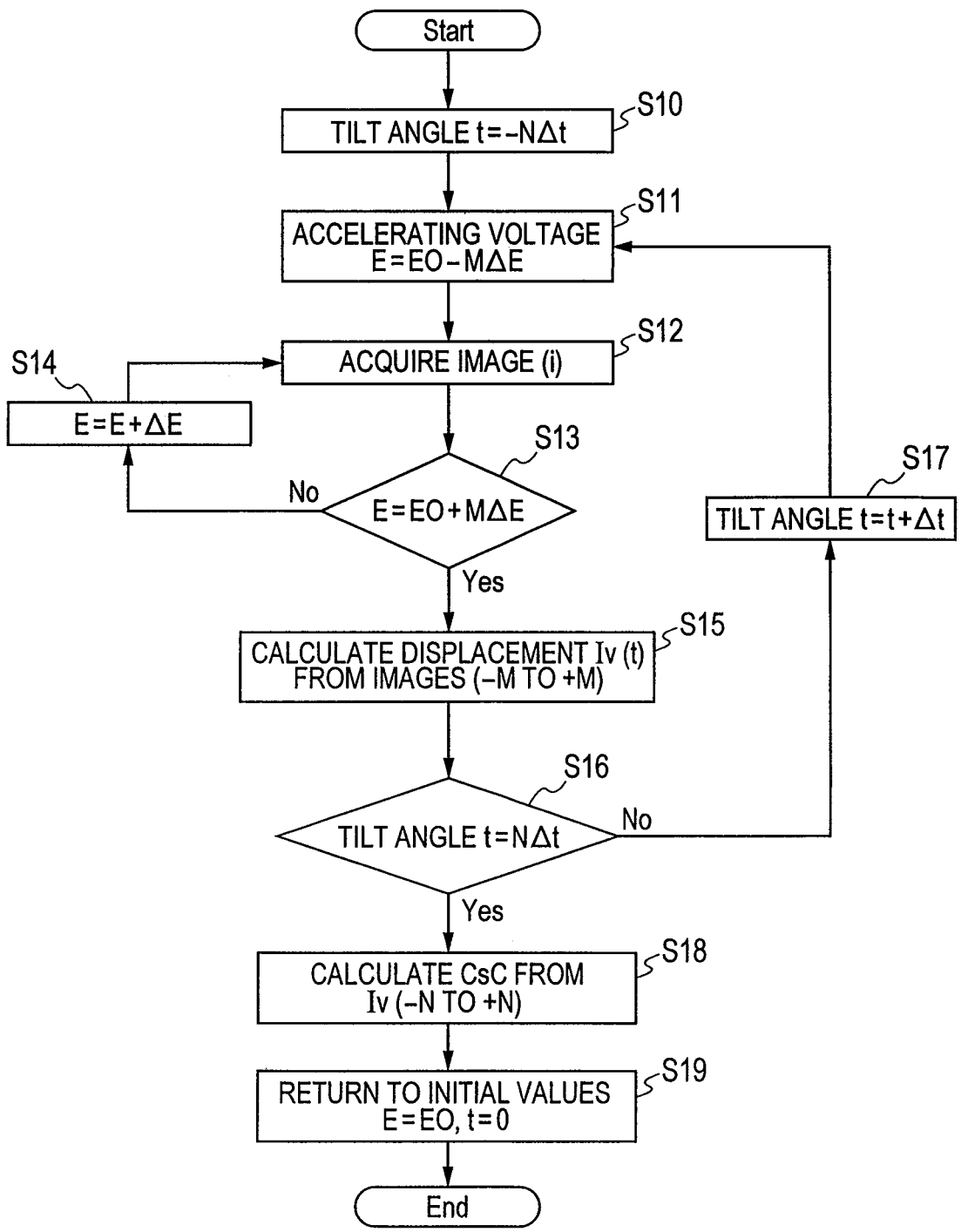
FIG. 2 is a diagram representing a flowchart of chromatic third-order aperture aberration measurement, pertaining to a first exemplary embodiment.

Next, the chromatic third-order aperture aberration measurement method according to the present exemplary embodiment is described. A flowchart shown in FIG. 2 represents a flow of the measurement. This flowchart primarily represents an operation flow by the above-mentioned control unit. Steps (S10 to S19) after measurement starts will be detailed later. As for tilts, although a tilt angle can be changed and rotated horizontally in full circle, it is assumed in the present exemplary embodiment that the tilt angle is only changed continuously in one given direction. A case is assumed where the measurement is performed, as the tilt angle is changed 2N+1 times for an interval of Δt and the accelerating voltage is changed 2M+1 times for an interval of ΔE, where N and M are a natural number of 1 or more. It is also assumed that the tilt angle t is an angle from a vertical direction in which the incident electron beam strikes on the specimen 18. The tilt angle t is set by deflecting the electron beam to go into the aberration corrector 10 by means of the deflector 8. At this time, the optical system makes an adjustment to change only the tilt angle t of the electron beam onto the specimen 18 without changing the object point of the objective lens. This adjustment is made by parallel translation of the electron beam, if the electron beam is parallel at the deflector 8. Conditions at start are as follows: the accelerating voltage E=E0, there is no tilt, axis adjustment has been made, chromatic, spherical, and third-order geometrical aberrations have been corrected, and SEM images can be acquired.

(S10): the process sets the tilt angle t to −NΔt. In the present exemplary embodiment, for simplicity, the initial tilt angle setting is −NΔt, but the procedure may start with any angle.

(S11): the process sets the accelerating voltage E to E0−MΔE. In the present exemplary embodiment, for simplicity, the initial accelerating voltage setting is E0−MΔE, but the procedure may start with any voltage.

(S12): the process acquires an image by processing signals from the secondary electron detector by the control computer 30. The acquired image is stored in the data storage 76 or the like. Images thus acquired are labeled in such a form: image (i), i=−M to +M in the order in which they have been acquired. Conditions when an image was acquired are also stored together with the image into the storage 76, so that an image and its associated conditions can be referred to later.

(S13): the process decides whether a condition for termination of changing the accelerating voltage is satisfied. Here, because of changing the accelerating voltage in steps, this decision is made depending on whether a predefined voltage has been reached, but the decision may be made by using the number of images acquired and its counter. If the condition for termination is satisfied, the process goes to step (S15); if not satisfied, the process goes to step (S14).

(S14): the process increases the accelerating voltage by an increment of ΔE and goes to step (S12) again. In this step, axis readjustment, focusing, astigmatism correction, etc. are not performed at all.

Figure 3:
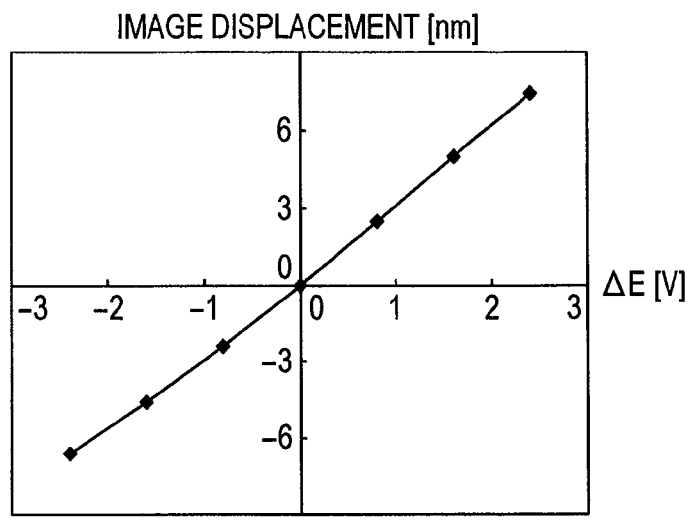
FIG. 3 is a graph representing an example of a relationship between variation of acceleration energy and image displacements, pertaining to the first exemplary embodiment.

(S15): the process calculates image displacements per change of the accelerating voltage. The image displacements are calculated separately with regard to two directions such as a tilt direction on the specimen surface and a direction orthogonal to the tilt. The image displacements can be calculated as follows: positional offsets between images acquired at step (S12) are obtained by using a correlation method or the like. An example of a graph plotting the image displacements in one direction and the accelerating voltage change is shown in FIG. 3. Displacements (nm) from the image acquired when E=E0 are plotted on the ordinate and the accelerating voltage change ΔE(V) is plotted on the abscissa. A gradient of this graph represents the displacements Iv(t) per change of the accelerating voltage. Displacements Iv(t) obtained with regard to two directions are stored as distinct ones for each direction in the data storage 76 or the like.

(S16): the process decides whether a condition for termination of changing the tilt angle is satisfied. Here, because of changing the tilt angle in steps, the decision is made depending on whether a predefined angle has been reached, but the decision may be made by using the number of displacements Iv(t) obtained and its counter. If the condition for termination is satisfied, the process goes to step (S18); if not satisfied, the process goes to step (S17).

(S17): the process increases the tilt angle by an increment of Δt and goes to step (S11) again. In this step, axis readjustment is not performed.

(S18): the process calculates a chromatic third-order aperture aberration quantity. Its procedure is as follows. In view of the displacements Iv(t) obtained at step (S15) in the tilt direction, plotting the displacements in relation to the tilt angles Iv(t)(nm/V) yields a graph as in FIG. 4. Here, displacement Iv(t) multiplied by accelerating voltage E0 corresponds to the sum of a deviation that is proportional to the cube of tilt angle t and has a coefficient of CsC (chromatic third-order aperture aberration coefficient), a deviation that is proportional to tilt angle t and has a coefficient of Cc (chromatic aberration coefficient), and a deviation that is proportional to energy and has a coefficient of CO (chromatic dispersion aberration) and this is expressed by a polynomial of Equation 1 below.

[Mathematical expression 1]

$$CsC \cdot t^3 + Cc \cdot t + CO \quad \text{(Equation 1)}$$

A third order coefficient CsC of this equation 1 is the chromatic third-order aperture aberration coefficient, a first order coefficient Cc is the chromatic aberration coefficient, and a constant term CO is the chromatic dispersion aberration quantity. Hence, from the third order coefficient of the foregoing polynomial, the chromatic third-order aperture aberration with regard to the tilt direction can be calculated. As described above, the calculation of the chromatic third-order aperture aberration can be executed by the CPU within the control computer 30 in the controller or the aberration computation device 79. Needless to say, this is the same for the calculation of other aberrations. Any calculation result is stored into the data storage 76 by the control computer 30, as previously noted.

(S19): the process returns the settings to those before the measurement starts.

By executing the foregoing steps (S10) to (S19), the chromatic third-order aperture aberration can be measured. In the foregoing flow, the tilt direction is one given direction (a positive or negative direction) for which the measurement is performed. However, by performing such measurement with regard to at least two directions such as orthogonal tilt directions, it is possible to make the chromatic third-order aperture aberration measurement taking asymmetry into consideration.

As for changing the tilt angle and the accelerating voltage, changes may be set to occur in order other than specified in the present exemplary embodiment, for example, a change in a positive direction and a change in a negative direction may be set to occur alternately, and change steps may not be even. However, it is preferable to change the accelerating voltage by several volts (V) and change the tilt angle within a range from several to ten degrees.

Next, the method for eliminating resolution degradation due to a chromatic third-order aperture aberration during tilt observation after aberration correction is described.

The method for eliminating resolution degradation according to the present exemplary embodiment is to counterbalance the chromatic aberration and the chromatic third-order aperture aberration. More specifically, the controller of the present exemplary embodiment has a chromatic aberration control function relevant to tilt observation of the specimen and, by means of the chromatic aberration control function, controls a chromatic aberration to be positive or negative, rather than remaining at 0, in order to eliminate an image blur which occurs in a direction parallel to the specimen surface due to a chromatic third-order aperture aberration and a chromatic aberration at a tilt angle under observation and another tilt angle axially opposite to the tilt angle.

For explanation in the following paragraphs, a state of resolution degradation due to a chromatic third-order aperture aberration when tilts occur is first described. After aberration correction, a chromatic aberration and geometrical aberrations of the third or less order are corrected. In this state, if an effective distance between the aberration corrector and the objective lens is not zero, a chromatic third-order aperture aberration occurs. Besides, higher order geometrical aberrations also occur. During tilt observation after aberration correction, resolution decreases, as the tilt angle becomes larger, under the influence of higher order aberrations. Because geometrical aberrations can be restricted by an aperture diameter, their influence can be suppressed by using an aperture with a smaller diameter. However, because the effect of energy dispersion occurs independently of the aperture diameter, the chromatic third-order aperture aberration cannot be restricted by using even a minute aperture. Therefore, the chromatic third-order aperture aberration is a major cause of resolution degradation during tilt observation after aberration correction.

Figure 4:
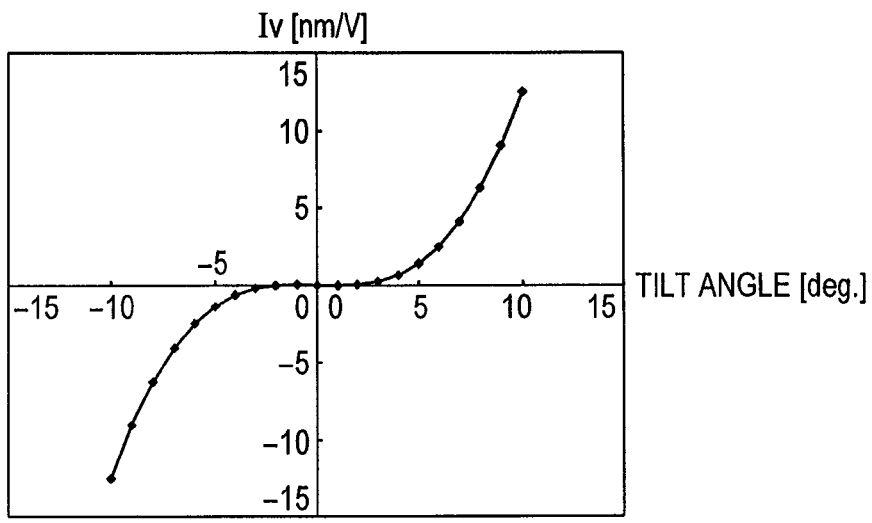
FIG. 4 is a graph representing an example of a relationship between tilt angles and image displacements per unit energy, pertaining to the first exemplary embodiment.

Counterbalancing the chromatic aberration and the chromatic third-order aperture aberration is described, using Equation 1 and FIG. 4. After aberration correction, Cc=0 and CO=0 in Equation 1 and dispersion in energy becomes larger with increasing tilt angles, as shown in FIG. 4. The aberration corrector 10 corrects the chromatic aberration and it is a device that controls increase or decrease of the chromatic aberration quantity as a function. Therefore, if the chromatic aberration coefficient Cc is controlled to satisfy Equation 2 below at a given tilt angle t1, it is possible to compensate for the effect of energy dispersion due to the chromatic third-order aperture aberration CsC at the tilt angle t1.

[Mathematical expression 2]

$$CsC \cdot t1^3 + Cc \cdot t1 = 0 \qquad \text{(Equation 2)}$$

Figure 5:
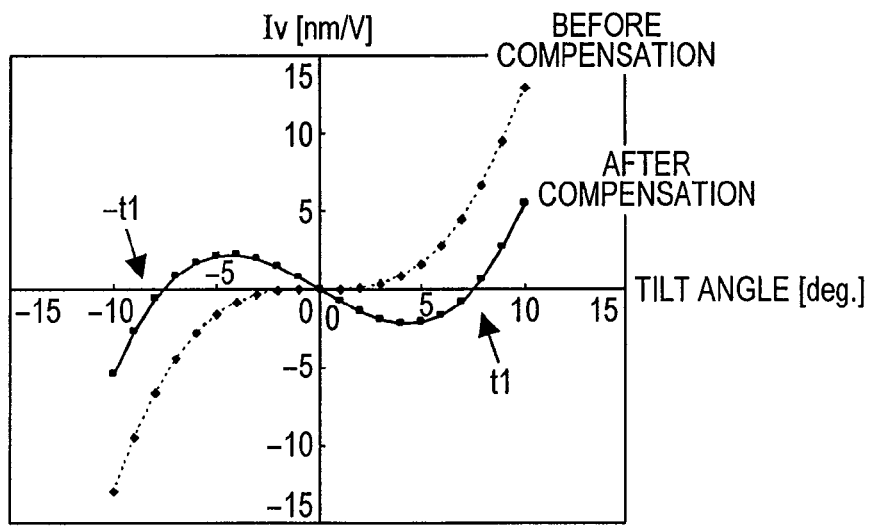
FIG. 5 is a graph representing an example of a change in the relationship between tilt angles and image displacements per unit energy by chromatic aberration control, pertaining to the first exemplary embodiment.

This state is shown in FIG. 5. A curve before compensation after aberration correction monotonically increases as a cubic function of t, whereas another curve in the graph intersects the Iv=0 level at the tilt angle t1 by adding a chromatic aberration to satisfy Equation 3 below.

[Mathematical expression 2]

$$Cc = -CsC \cdot t1^2 \qquad \text{(Equation 3)}$$

Then, the condition for compensating for the chromatic third-order aperture aberration is also satisfied at a tilt angle −t1. Thus, in the present exemplary embodiment, it is possible to promptly make an observation from two different angles of t1 and −t1. CsC is a function of an amount of chromatic aberration correction and changes with a change of Cc and, therefore, Cc after adjustment differs from a simple quadratic function of the tilt angle, but there is a solution of adjustment.

The preceding paragraphs have set forth the method for eliminating resolution degradation due to a chromatic third-order aperture aberration during tilt observation after aberration correction according to the present exemplary embodiment. Although an example of the method applied for given angles t1 and −t1 is presented in this exemplary embodiment, for different tilt angles, the compensation can be achieved by adjusting the chromatic aberration quantity. For compatibility with on-axis observation at a high resolution, operation may be carried out such that, only when tilts occur, the chromatic aberration is controlled to change, based on a table prepared beforehand. In this regard, a slight difference from the condition for chromatic third-order aperture aberration compensation can be rectified relatively easily by a fine adjustment of the tilt angle.

According to the method described in the present exemplary embodiment detailed hereinbefore, a high resolution in tilt observation upon aberration correction can be achieved without needing to fix optical conditions. It is also possible to make an observation, while quickly switching between tilt observations from two directions.

Second Embodiment

Next, as a second exemplary embodiment, an exemplary embodiment of a method for eliminating resolution degradation due to a chromatic third-order aperture aberration during tilt observation after aberration correction by using a chromatic dispersion aberration is described. As for the apparatus structure for the present exemplary embodiment, the same one as for a first exemplary embodiment is used.

In the present exemplary embodiment, the control unit 103 which is the controller of the scanning electron microscope (SEM) has a chromatic dispersion aberration control function and, by means of the chromatic dispersion aberration control function, controls a chromatic dispersion aberration to be positive or negative, rather than remaining at 0, when no tilt occurs, in order to eliminate an image blur which occurs in a direction parallel to the specimen surface due to a chromatic third-order aperture aberration and a chromatic aberration at a tilt angle under observation.

The method of the present exemplary embodiment is to counterbalance the chromatic dispersion aberration and the chromatic third-order aperture aberration. After aberration correction, if the chromatic dispersion aberration is controlled by the aberration corrector to satisfy Equation 4 below at a given tilt angle t1 in Equation 1, it is possible to compensate for the effect of energy dispersion due to the chromatic third-order aperture aberration at the tilt angle t1. This state is shown in FIG. 6.

[Mathematical expression 4]

$$CsC \cdot t1^3 + CO = 0 \quad \text{(Equation 4)}$$

Figure 6:
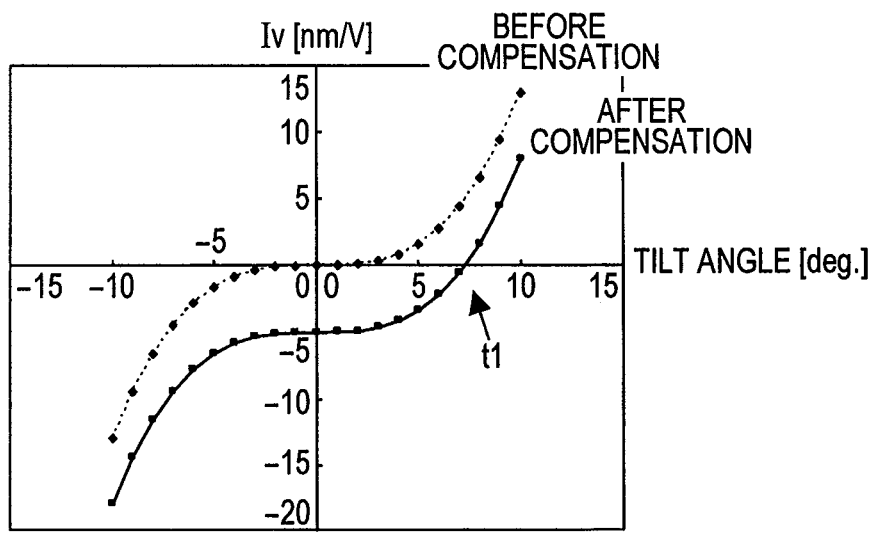
FIG. 6 is a graph representing an example of a change in the relationship between tilt angles and image displacements per unit energy by chromatic dispersion aberration control, pertaining to a second exemplary embodiment.

As is seen in FIG. 6, a curve after compensation intersects the Iv=0 level at the tilt angle t1 by adding a chromatic dispersion aberration to satisfy Equation 5 below.

[Mathematical expression 5]

$$CO = -CsC \cdot t1^3 \quad \text{(Equation 5)}$$

A difference from the first exemplary embodiment lies in that the condition for compensating for the chromatic third-order aperture aberration is not satisfied at a tilt angle −t. Besides, because the chromatic dispersion aberration is caused to occur, resolution degradation takes place in a state when no tilt occurs. Because CsC remains unchanged even when the chromatic dispersion aberration is changed, it becomes simple to predict a solution. The most advantage is that chromatic third-order aperture aberration compensation can be accomplished, while the corrected chromatic aberration is maintained.

Although an example of the method applied for a given angle is presented in this exemplary embodiment, the chromatic third-order aperture aberration compensation can also be achieved for different tilt angles by adjusting the chromatic dispersion aberration quantity. However, because the chromatic dispersion aberration quantity must be changed in proportion to the cube of the tilt angle, a cubic change of an adjustment voltage or the like is required and an adjustable range for tilt angles is narrower than in the first exemplary embodiment because of a power supply limitation. For compatibility with on-axis observation at a high resolution, operation may be carried out such that, only when tilts occur, the chromatic dispersion aberration is controlled to change, based on a table prepared beforehand. In this regard, a slight difference in chromatic third-order aperture aberration compensation can be rectified relatively easily by a fine adjustment of the tilt angle.

According to the method described in the present exemplary embodiment, a high resolution in tilt observation upon aberration correction can be achieved without needing to fix optical conditions.

Third Embodiment

Then, as a third exemplary embodiment, an exemplary embodiment of a method for eliminating resolution degradation due to a chromatic third-order aperture aberration during tilt observation after aberration correction by means of spherical aberration control is described. As for the apparatus structure for the present exemplary embodiment, the same one as for the first exemplary embodiment is used.

The controller of the scanning electron microscope (SEM) in the present exemplary embodiment has a spherical aberration control function relevant to tilt observation of the specimen using an irradiation angle control function and, by means of the spherical aberration control function, controls a spherical aberration to be positive or negative, rather than remaining at 0, in order to eliminate an image blur which occurs in a direction parallel to the specimen surface due to a chromatic third-order aperture aberration and a chromatic aberration at a tilt angle under observation.

Figure 7:
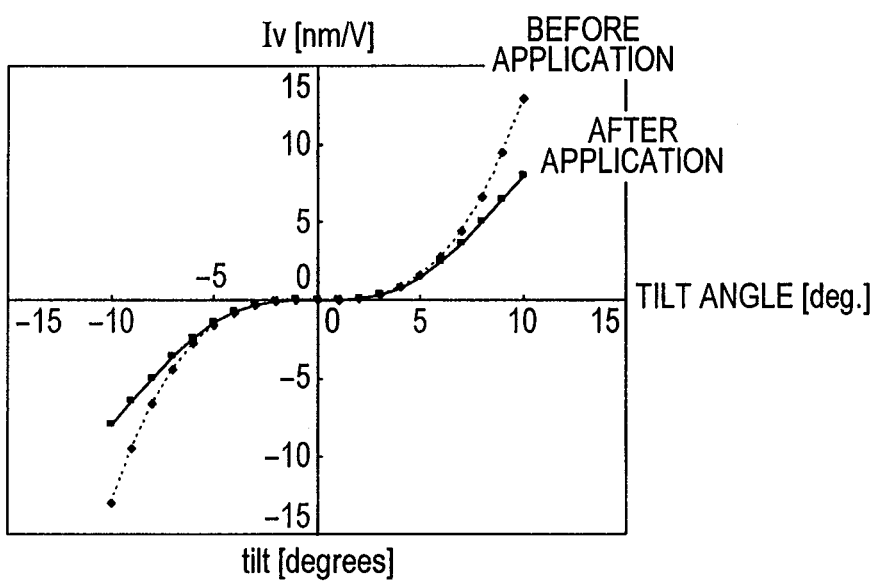
FIG. 7 is a graph representing an example of a change in the relationship between tilt angles and image displacements per unit energy by spherical aberration control, pertaining to a third exemplary embodiment.

Because this chromatic third-order aperture aberration is a function of an amount of spherical aberration correction, this aberration can be reduced by changing the amount of the spherical aberration correction. It is also possible to counterbalance a higher order chromatic third-order aperture aberration which is proportional to the first order of energy and the fifth order of an aperture angle and the chromatic third-order aperture aberration. This state is shown in FIG. 7. By applying the method of the present exemplary embodiment, the chromatic third-order aperture aberration can be reduced. In this method, only a spherical aberration that corresponds to the tilt direction may be increased or decreased. Concretely, in a 4-pole 4-stage type aberration corrector, an octupole assigned for spherical aberration correction in a direction that matches the tilt direction is only to work for changing the spherical aberration, thus controlling only the spherical aberration with regard to the tilt direction. In this way, it is possible to correct only the aberration occurring due to the tilt, while avoiding additional irrelevant aberrations from occurring.

Unlike the first and the second exemplary embodiments, the method of the present exemplary embodiment is unable to create a condition that zeroes the effect of the chromatic third-order aperture aberration at a given tilt angle in a practical range of a voltage or current that is applied to the aberration corrector. For this reason, in addition to the above-mentioned spherical aberration control, counterbalancing the chromatic aberration and the chromatic third-order aperture aberration described in the first exemplary embodiment or counterbalancing the chromatic dispersion aberration and the chromatic third-order aperture aberration described in the second exemplary embodiment or both of these methods may be used in combination with the method of a third exemplary embodiment to zero the effect of the chromatic third-order aperture aberration at a given tilt angle. Use of this method can reduce a voltage or current required for correction, as compared with other methods, but results in an increase of spherical aberrations. However, the influence of remaining spherical aberration components and a fifth order spherical aberration can be reduced by adding a hexapole for coma aberration correction and astigmatism correction.

The preceding paragraphs have set forth the exemplary embodiment concerning the method for reducing the chromatic third-order aperture aberration by means of spherical aberration control. According to the method described in the present exemplary embodiment, a high resolution in tilt observation upon aberration correction can be achieved without needing to fix optical conditions.

Fourth Embodiment

Next, as a fourth exemplary embodiment, another measurement method different from the chromatic third-order aperture aberration measurement method of the first exemplary embodiment is presented. As for the apparatus structure for the present exemplary embodiment, the same one as for the first exemplary embodiment is used.

According to the present exemplary embodiment, the controller of the scanning electron microscope (SEM) causes defocusing to arise by control of changing the accelerating voltage and calculates defocus amounts and direction per unit voltage of the accelerating voltage changed for defocusing. When calculating the defocus amounts and direction per unit voltage, the controller measures tilts of the primary charged particle beam for at least two different angles in a same direction with respect to the axis of tilt. Then, the controller approximates the defocus amounts per unit voltage with a variable for which the tilt angles are assigned as a polynomial which is a second or higher order function and calculates a chromatic third-order aperture aberration quantity from a third order coefficient of this polynomial.

Figure 8:
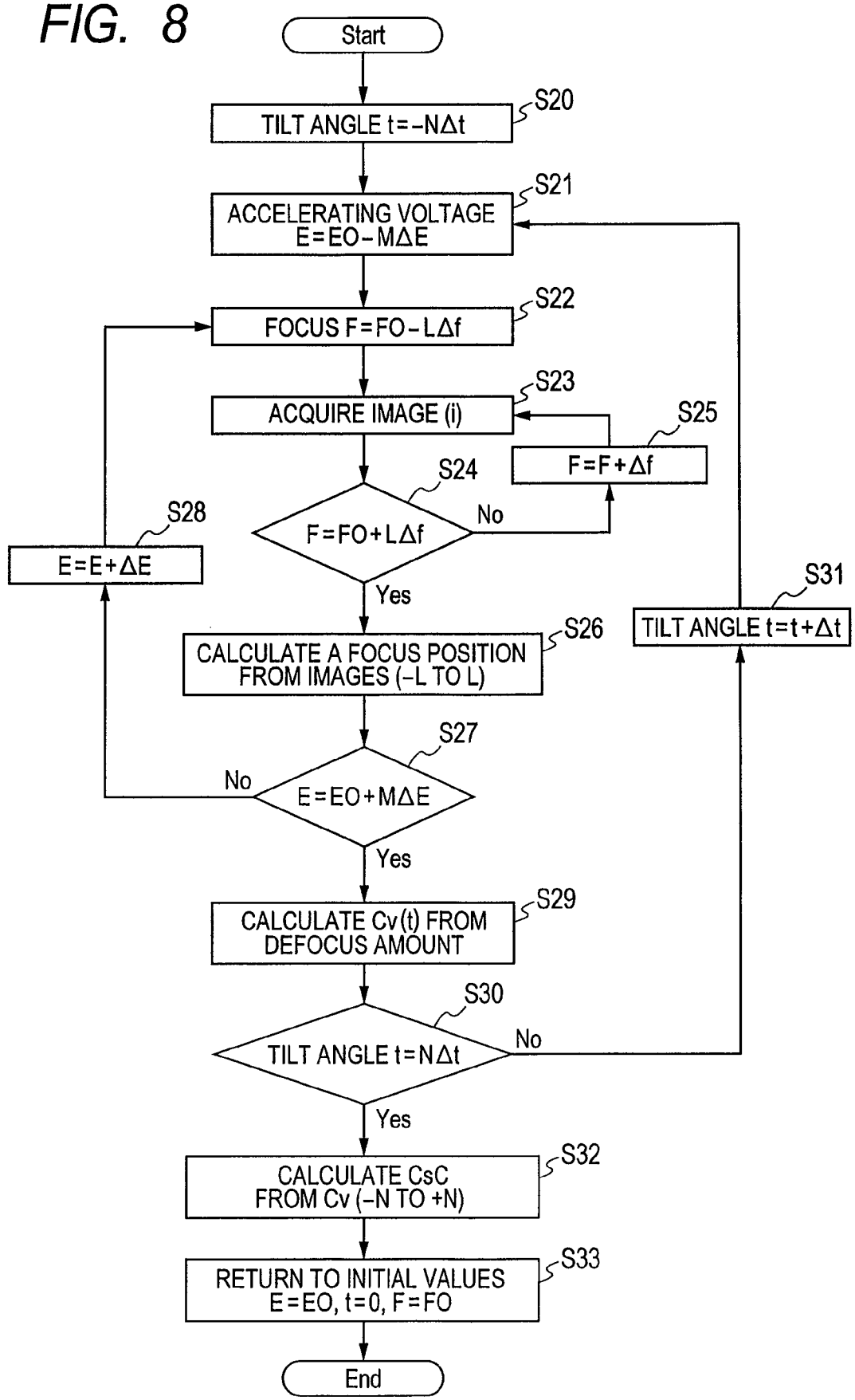
FIG. 8 is a diagram representing a flowchart of chromatic third-order aperture aberration measurement of a fourth exemplary embodiment.

A flow of the chromatic third-order aperture aberration measurement method according to the present exemplary embodiment is described with a flowchart shown in FIG. 8. Although the measurement can be performed, while changing a tilt angle in different directions, the measurement is performed for one given direction fixed, while changing the tilt angle. More specifically, a case is assumed where the measurement is performed, as the tilt angle is changed 2N+1 times for an interval of Δt, the accelerating voltage is changed 2M+1 times for an interval of ΔE, and the focus value is changed 2L+1 times for an interval of Δf. Here, as the focus value, inter alia, a current value supplied to the objective lens 17 for focusing on the specimen and a retarding voltage value of the retarding power supply 29 can be used. The focus value may be any such a value that changes the focus position of the electron beam and, from a difference from the initial focus value, an actual defocus amount on the specimen surface can be converted to a distance. It is assumed that the tilt angle t is an angle from a vertical direction in which the incident electron beam strikes on the specimen 18, as is the case for the first exemplary embodiment. The tilt angle is set by deflecting the electron beam to go into the aberration corrector 10 by means of the deflector 8. At this time, the optical system makes an adjustment to change only the tilt angle of the electron beam onto the specimen 18 without changing the object point. Conditions at start in this example are as follows: the accelerating voltage E=E0, there is no tilt (t=0), the focus value F=F0, axis adjustment has been made, chromatic, spherical, and third-order geometrical aberrations have been corrected, and SEM images can be acquired. For the measurement conditions, it is not necessary that aberrations have been corrected.

(S20): the process sets the tilt angle t to −NΔt. In the present exemplary embodiment, for simplicity, the initial tilt angle setting is −NΔt, but the order in which a series of tilt angles should be set is of no importance.

(S21): the process sets the accelerating voltage E to E0−MΔE. In the present exemplary embodiment, for simplicity, the initial accelerating voltage setting is E0−MΔE, but the order in which a series of accelerating voltages should be set is of no importance.

(S22): the process sets the focus value F to F0−LΔf. In the present exemplary embodiment, for simplicity, the initial focus value setting is F0−LΔf, but the order in which a series of focus values should be set is of no importance.

(S23): the process acquires an image. The acquired image is stored in the data storage 76 or the like. Images thus acquired are labeled in such a form: image (i), i=−L to +L in the order in which they have been acquired. Conditions when an image was acquired are also stored together with the image into the storage 76, so that an image and its associated conditions can be referred to later.

(S24): the process decides whether a condition for termination of changing the focus value is satisfied. Here, because of changing the focus value in steps, this decision is made depending on whether a predefined focus value has been reached, but the decision may be made by using the number of images acquired and its counter. If the condition for termination is satisfied, the process goes to step (S26); if not satisfied, the process goes to step (S25).

(S25): the process increases the focus value by an increment of Δf and goes to step (S23) again. In this step, axis readjustment is not performed, but image shifting may be performed.

(S26): the process calculates a focus position at the accelerating voltage E. Focus positions are calculated separately with regard to two directions such as a tilt direction on the specimen surface and a direction orthogonal to the tilt. A focus position is calculated based on the focus value for the sharpest one of images acquired at step (S23) with regard to a target direction.

The sharpest image with regard to a given direction can be obtained by a conventional method for use in an astigmatism aberration measurement, such as, e.g., differentiating images. Focus positions obtained with regard to two directions are stored as distinct ones for each direction in the data storage 76 or the like. Each focus position associated with an accelerating voltage and a tilt angle is stored.

(S27): the process decides whether a condition for termination of changing the accelerating voltage is satisfied. Here, because of changing the accelerating voltage in steps, this decision is made depending on whether a predefined voltage has been reached, but the decision may be made by using the number of images acquired and its counter. If the condition for termination is satisfied, the process goes to step (S29); if not satisfied, the process goes to step (S28).

(S28): the process increases the accelerating voltage by an increment of ΔE and goes to step (S22) again.

Figure 9:
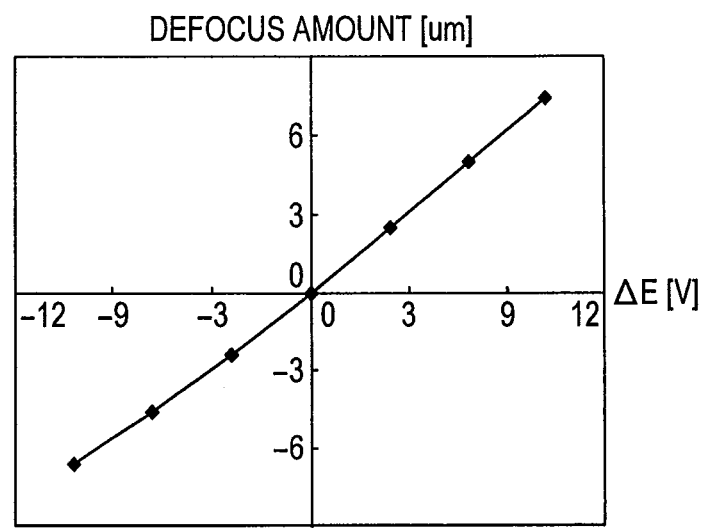
FIG. 9 is a graph representing an example of a relationship between variation of acceleration energy and defocus amounts, pertaining to the fourth exemplary embodiment.

(S29): the process calculates amounts of focus change Cv(t) per change of the accelerating voltage. Cv(t) values are calculated separately with regard to two directions such as a tilt direction on the specimen surface and a direction orthogonal to the tilt. A graph plotting the differences of focus positions obtained for each voltage of E from the origin focus position when E=E0 and variation of the accelerating voltage with regard to one direction is shown in FIG. 9. Focus position deviations from E=E0 (defocus amounts) are plotted on the ordinate and the accelerating voltage variation is plotted on the abscissa. A gradient of this graph represents the amounts of focus change Cv(t) per change of the accelerating voltage. Cv(t) values obtained with regard to two directions are stored as distinct ones for each direction in the data storage 76 or the like.

(S30): the process decides whether a condition for termination of changing the tilt angle is satisfied. Here, because of changing the tilt angle in steps, the decision is made depending on whether a predefined angle has been reached, but the decision may be made by using the number of displacements Iv(t) obtained and its counter. If the condition for termination is satisfied, the process goes to step (S32); if not satisfied, the process goes to step (S31).

(S31): the process increases the tilt angle by an increment of Δt and goes to step (S21) again. In this step, axis readjustment is not performed.

Figure 10:
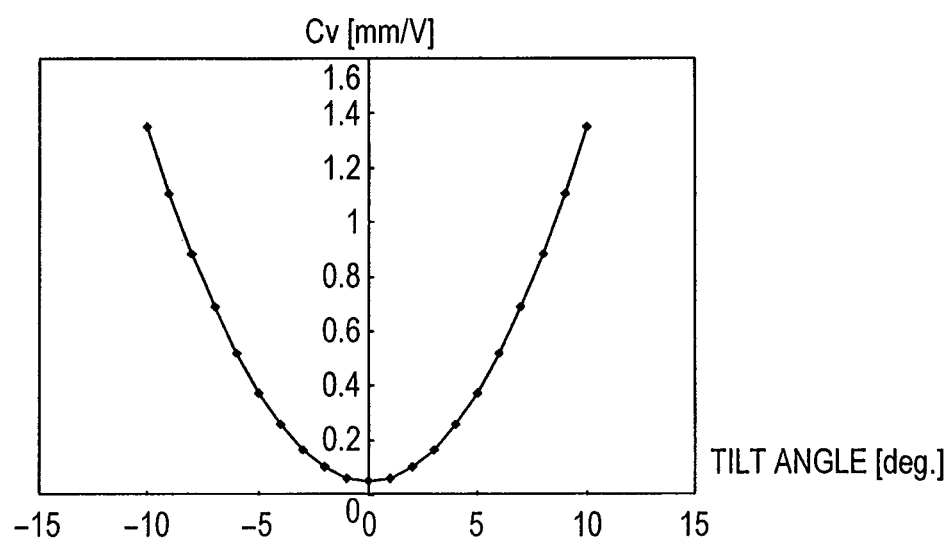
FIG. 10 is a graph representing an example of a relationship between tilt angles and defocus amounts per unit energy, pertaining to the fourth exemplary embodiment.

(S32): the process calculates a chromatic third-order aperture aberration quantity. Its procedure is as follows. In view of the Cv(t) values obtained at step (S29) in the tilt direction, plotting the Cv values in relation to the tilt angles yields a graph as in FIG. 10. The graph can be approximated by a quadratic function of tilt angle t and multiplying it by the accelerating voltage yields Equation 6 below.

[Mathematical expression 6]

$$3 \cdot CsC \cdot t^2 + Cc \qquad \text{(Equation 6)}$$

A second order coefficient CsC of Equation 6 is the chromatic third-order aperture aberration coefficient and a constant term Cc is the chromatic aberration coefficient. Hence, from the second order coefficient, the chromatic third-order aperture aberration with regard to the tilt direction can be calculated. Cv(t) values with regard to a direction orthogonal to the tilt direction have been calculated at step (S29). Because the tilt angle in the orthogonal direction is 0, Cc in the orthogonal direction can be calculated.

(S33): the process returns the settings to those before the measurement starts.

By executing the foregoing steps (S20) to (S33), the chromatic third-order aperture aberration can also be measured. The method of the present exemplary embodiment is based on defocusing and, thus, influenced by the diameter of an aperture. Therefore, if the aperture diameter is not ignorable with respect to the tilt angle, calculation is executed taking the aperture diameter into consideration. For example, with respect to a tilt, given that the tilt angle of the electron beam passing within the aperture is α1 and the tilt angle of the beam passing outside the aperture is α2, a defocus amount is obtained by solving a simultaneous equation of Equation 7 below.

[Mathematical expression 7]

$$y = CsC \cdot \alpha1^2 + \frac{x}{\tan\alpha1},$$
$$y = CsC \cdot \alpha2^2 + \frac{x}{\tan\alpha2}$$

(Equation 7)

(x is a distance from the axis and y is a defocus amount)

In the foregoing measurement flow, the tilt direction is one given direction for which the measurement is performed. However, by performing such measurement with regard to at least two directions such as orthogonal tilt directions, it is possible to make the chromatic third-order aperture aberration measurement taking asymmetry into consideration.

According to the method described above, the chromatic third-order aperture aberration measurement can be accomplished. Difference in the effect between the present exemplary embodiment and the first exemplary embodiment is described. Any exemplary embodiment is able to measure both a chromatic third-order aperture aberration and a chromatic aberration, but the present exemplary embodiment, solely, cannot measure a chromatic dispersion aberration. The method of the first exemplary embodiment needs to detect image displacements and, thus, may not take measurements well, if an image displacement more than expected occurs or if an image blur is larger than image displacement. By contrast, the method of the present exemplary embodiment handles a blur itself and is not necessarily required to include a same field of view; therefore, its measurable range is relatively wide. Because the change degree differs due to a difference in order with regard to tilt angles, the first exemplary embodiment is suitable for measurement of a relatively small chromatic third-order aperture aberration and the present exemplary embodiment is suitable for measurement of a relatively large chromatic third-order aperture aberration.

While preferred embodiments of the present invention have been described hereinbefore by way of various exemplary embodiments, it is obvious that the present invention is not limited to the foregoing embodiments. For example, a charged particle beam apparatus can also be configured such that its controller has at least any two of the chromatic aberration control function, chromatic dispersion aberration control function, and spherical aberration control function relevant to tilt observation of the specimen using an irradiation angle control function of charged particle beam application apparatus and, by means of the at least two functions, the controller implements control to eliminate an image blur which occurs in a direction parallel to the specimen surface due to a chromatic third-order aperture aberration and a chromatic aberration at a tilt angle under observation and to make an observation, while selecting a combination that minimizes an image blur which occurs due to a chromatic aberration and a spherical aberration involved during an elimination process.

INDUSTRIAL APPLICABILITY

The present invention is useful as scanning charged particle beam apparatus such as a scanning electron microscope, semiconductor inspection apparatus, scanning transmission electron microscope, and convergent ion beam apparatus.

REFERENCE SIGNS LIST

1 . . . Schottky electron source, 2 . . . Suppressor electrode, 3 . . . Extraction electrode, 4 . . . First anode, 5 . . . Second anode, 6 . . . First condenser lens, 7 . . . Second condenser lens, 8 . . . Deflector, 9 . . . Movable aperture, 10 . . . Aberration corrector, 11 . . . Astigmatism correction coil, 12 . . . Objective aligner, 15 . . . Scanning deflector, 16 . . . Lower scanning coil, 17 . . . Objective lens, 18 . . . Specimen, 20 . . . Electron gun's power supply, 21 . . . Control voltage source, 22 . . . Accelerating voltage source, 23 . . . First condenser lens's power supply, 24 . . . Second condenser lens's power supply, 25 . . . Deflection coil's power supply, 26 . . . Aberration corrector's power supply, 27 . . . Scanning coil's power supply, 28 . . . Objective lens's power supply, 29 . . . Retarding power supply, 30 . . . Control computer, 32 . . . Astigmatism correction coil's power supply, 33 . . . Objective aligner's power supply, 60 . . . Optical axis, 71 . . . E×B deflector, 72 . . . Reflector, 73 . . . Secondary electron detector, 74 . . . Secondary electron detector's power supply, 75 . . . E×B deflector's power supply, 76 . . . Data storage, 77 . . . Monitor, 78 . . . Operator console, 79 . . . Aberration computation device, 80 . . . Specimen stage, 81 . . . Specimen stage control mechanism, 100 . . . Vacuum vessel, 101 . . . Column, 102 . . . Specimen chamber, 103 . . . Control unit

The invention claimed is:

1. A scanning charged particle beam apparatus making use of a charged particle beam, the scanning charged particle beam apparatus comprising:
 a specimen stage on which a specimen is mounted; an aberration corrector that corrects an aberration of an incoming primary charged particle beam;
 a deflector that is disposed above the aberration corrector and that deflects the primary charged particle beam;
 an irradiation optical system that scans the primary charged particle beam over a specimen mounted on the specimen stage;
 a detector that detects secondary charged particles generated from the specimen by scanning the charged particle beam;
 a display unit that displays an image from output signals of the detector; and
 a controller that implements control to measure a chromatic third-order aperture aberration quantity by changing the angle and direction of irradiation of the primary charged particle beam onto the specimen by means of the deflector and by changing an accelerating voltage for the primary charged particle beam by means of the deflector.

2. The scanning charged particle beam apparatus according to claim 1, wherein:
the controller in the measuring of a chromatic third-order aperture aberration quantity, with regard to image displacement occurring with changing the accelerating voltage, calculates image displacements and direction per unit voltage of the accelerating voltage changed;
in the calculation of the image displacements and direction per unit voltage, the controller measures tilts of the primary charged particle beam for at least three different angles in a same direction with respect to the axis of tilt, approximates the image displacements per unit voltage with a variable for which the tilt angles are assigned as a polynomial, and calculates a chromatic third-order aperture aberration quantity from a third order coefficient of the polynomial.

3. The scanning charged particle beam apparatus according to claim 1, wherein:
the controller in the measuring of a chromatic third-order aperture aberration quantity, causes defocusing to arise by changing the accelerating voltage and calculates defocus amounts and direction per unit voltage of the accelerating voltage changed for the defocusing; when calculating the defocus amounts and direction per unit voltage, the controller measures tilts of the primary charged particle beam for at least two different angles in a same direction with respect to the axis of tilt, approximates the defocus amounts per unit voltage with a variable for which the tilt angles are assigned as a polynomial, and calculates a chromatic third-order aperture aberration quantity from a second order coefficient of the polynomial.

4. The scanning charged particle beam apparatus according to claim 1, wherein:
the controller has a chromatic aberration control function relevant to tilt observation of the specimen and, by means of the chromatic aberration control function, controls a chromatic aberration to be positive or negative, rather than remaining at 0, in order to eliminate an image blur which occurs in a direction parallel to the specimen surface due to a chromatic third-order aperture aberration and a chromatic aberration at a tilt angle under observation and another tilt angle axially opposite to the tilt angle.

5. The scanning charged particle beam apparatus according to claim 1, wherein:
the controller has a chromatic dispersion aberration control function relevant to tilt observation of the specimen and, by means of the chromatic dispersion aberration control function, controls a chromatic dispersion aberration to be positive or negative, rather than remaining at 0, when no tilt occurs, in order to eliminate an image blur which occurs in a direction parallel to the specimen surface due to a chromatic third-order aperture aberration and a chromatic aberration at a tilt angle under observation.

6. The scanning charged particle beam apparatus according to claim 1, wherein:
the controller has a spherical aberration control function relevant to tilt observation of the specimen and, by means of the spherical aberration control function, controls a spherical aberration to be positive or negative, rather than remaining at 0, in order to eliminate an image blur which occurs in a direction parallel to the specimen surface due to a chromatic third-order aperture aberration and a chromatic aberration at a tilt angle under observation.

7. The scanning charged particle beam apparatus according to claim 1, wherein:
the controller includes at least any two of a chromatic aberration control function, a chromatic dispersion aberration control function, and a spherical aberration control function relevant to tilt observation with an irradiation angle control function and, by means of the at least two functions, implements control to eliminate an image blur which occurs in a direction parallel to the specimen surface due to a chromatic third-order aperture aberration and a chromatic aberration at a tilt angle under observation and to make an observation, while selecting a combination that minimizes an image blur which occurs due to a chromatic aberration and a spherical aberration involved during an elimination process.

8. A scanning charged particle beam apparatus making use of a charged particle beam comprising:
a specimen stage on which a specimen is mounted;
an irradiation optical system that scans a primary charged particle beam over a specimen mounted on the specimen stage;
a detector that detects secondary charged particles generated from the specimen by scanning the primary charged particle beam;
a display unit that displays an image from output signals of the detector;
a controller that controls the specimen stage, the irradiation optical system, the detector, and the display unit; and
a storage unit connected to the controller,
wherein:
the irradiation optical system comprises an aberration corrector that corrects an aberration of the incoming primary charged particle beam and a deflector that is disposed above the aberration corrector that deflects the primary charged particle beam; and
the controller stores, into the storage unit, a chromatic third-order aperture aberration quantity measured by control of changing the angle and direction of irradiation of the primary charged particle beam onto the specimen by means of the deflector and changing an accelerating voltage for the primary charged particle beam.

9. A chromatic third-order aperture aberration measurement method for execution by a controller of a charged particle beam apparatus having a specimen stage on which a specimen is mounted, an aberration corrector that corrects an aberration of an incoming primary charged particle beam, and a deflector that is disposed above the aberration corrector that deflects the primary charged particle beam, and comprising an irradiation optical system that scans the primary charged particle beam over a specimen mounted on the specimen stage, a detector that detects secondary charged particles generated from the specimen by scanning the charged particle beam, and a display unit that displays an image from output signals of the detector,
the chromatic third-order aperture aberration measurement method comprising: measuring a chromatic third-order aperture aberration quantity by control of changing the angle and direction of irradiation of the primary charged particle beam onto the specimen by means of the deflector and changing an accelerating voltage for the primary charged particle beam by means of the deflector.

10. The chromatic third-order aperture aberration measurement method according to claim 9, wherein:
the measuring of a chromatic third-order aperture aberration quantity comprises, with regard to image displacement occurring with changing the accelerating voltage, calculating image displacements and direction per unit voltage of the accelerating voltage changed; and the calculating of the image displacements and direction per unit voltage comprises measuring tilts of the primary charged particle beam for at least three different angles in a same direction with respect to the axis of tilt, approximating the image displacements per unit voltage with a variable for which the tilt angles are assigned as a polynomial, and calculating a chromatic third-order aperture aberration quantity from a third order coefficient of the polynomial.

11. The chromatic third-order aperture aberration measurement method according to claim 9, wherein:

The measuring of a chromatic third-order aperture aberration quantity comprises causing defocusing to arise by changing the accelerating voltage and calculating defocus amounts and direction per unit voltage of the accelerating voltage changed for the defocusing; and the calculating of the defocus amounts and direction per unit voltage comprises measuring tilts of the primary charged particle beam for at least two different angles in a same direction with respect to the axis of tilt, approximating the defocus amounts per unit voltage with a variable for which the tilt angles are assigned as a polynomial, and calculating a chromatic third-order aperture aberration quantity from a second order coefficient of the polynomial.

12. The chromatic third-order aperture aberration measurement method according to claim 9, wherein:

the measurement method includes a chromatic aberration control function relevant to tilt observation of the specimen and comprises controlling a chromatic aberration to be positive or negative, rather than remaining at 0, by means of the chromatic aberration control function, so that an image blur which occurs in a direction parallel to the specimen surface due to a chromatic third-order aperture aberration and a chromatic aberration at a tilt angle under observation is controlled not to occur at the tilt angle and another tilt angle axially opposite to the tilt angle.

* * * * *